United States Patent [19]
Davis et al.

[11] Patent Number: 6,046,901
[45] Date of Patent: Apr. 4, 2000

[54] SUPPORT STRUCTURE, ELECTRONIC ASSEMBLY

[75] Inventors: Benjamin R. Davis; Brian A. Webb, both of Chandler, Ariz.

[73] Assignee: Motorola, Inc., Schaumburg, Ill.

[21] Appl. No.: 09/072,196

[22] Filed: May 4, 1998

[51] Int. Cl.[7] .......................... H01G 4/005; H01G 4/228; H05K 1/18
[52] U.S. Cl. ...................... 361/303; 361/813; 361/306.1; 361/763; 361/806
[58] Field of Search .................................. 361/763, 765, 361/766, 811, 813, 820, 821, 806, 807, 301.3, 303, 305, 308.1, 308.3, 320, 328, 517–519, 534–537; 257/701, 666, 532–535, 691, 705, 723, 724, 924; 228/180.22, 180.1; 427/79

[56] References Cited

U.S. PATENT DOCUMENTS

| | | | |
|---|---|---|---|
| 4,451,845 | 5/1984 | Philofsky et al. | 257/703 |
| 4,558,812 | 12/1985 | Bailey et al. | 228/180.1 |
| 4,688,322 | 8/1987 | Fossey | 29/25.03 |
| 4,752,027 | 6/1988 | Gschwend | 228/180.22 |
| 4,821,005 | 4/1989 | Kling | 333/167 |
| 5,229,640 | 7/1993 | Pak | 257/666 |
| 5,764,485 | 6/1998 | Lebaschi | 361/774 |

*Primary Examiner*—Kristine Kincaid
*Assistant Examiner*—Anthony Dinkins
*Attorney, Agent, or Firm*—Rennie William Dover

[57] ABSTRACT

An electronic assembly (10) includes a chip capacitor (11) having two major surfaces (12, 15) and a pair of electrodes (13, 14). A plurality of electrically conductive traces (20–23, 25–28) are formed on one (12) of the major surfaces. Some of the plurality of electrically conductive traces are electrically coupled to a first electrode (14) and some of the plurality of electrically conductive traces are coupled to a second electrode (14) of the pair of electrodes. Electronic circuit elements (16, 17, 18) are coupled to the plurality of electrically conductive traces (20–23, 25–28), thereby forming the electronic assembly (10).

15 Claims, 3 Drawing Sheets

SUPPORT STRUCTURE, ELECTRONIC ASSEMBLY

BACKGROUND OF THE INVENTION

The present invention relates, in general, to electronic assemblies and, more particularly, to compact electronic assemblies.

Electronic systems are typically an integral part of most control systems found in automobiles, aircraft, ships, factories, appliances, etc. These systems are generally comprised of one or more electronic assemblies that cooperate with mechanical structures to perform a desired function. For example, airbag firing units found in automobiles cause airbags to deploy in the event of an accident. It is generally desirable for the electronic assemblies to be small, light, and energy efficient. However, because conventional electronic assemblies include a plurality of electrical and electronic circuit elements mounted to a printed circuit board they tend to be large and relatively heavy.

Accordingly, it would be advantageous to have a small, lightweight electronic assembly and method for manufacturing the small, lightweight electronic assembly. It would be of further advantage for the electronic assembly to be cost efficient.

DETAILED DESCRIPTION OF THE DRAWINGS

Generally, the present invention provides an electronic assembly and a method for manufacturing the electronic assembly. In accordance with the present invention, the electronic assembly includes a semiconductor device mounted to an electrical component such as, for example, a chip capacitor. The electrical component has a major surface on which one or more electrically conductive traces are formed. Circuit elements or electronic components such as integrated circuits, capacitors, diodes, and the like are coupled to the electrically conductive traces. Electronic assemblies having circuit elements mounted to electrical components reduce the size of the electronic assembly.

Figure 1:
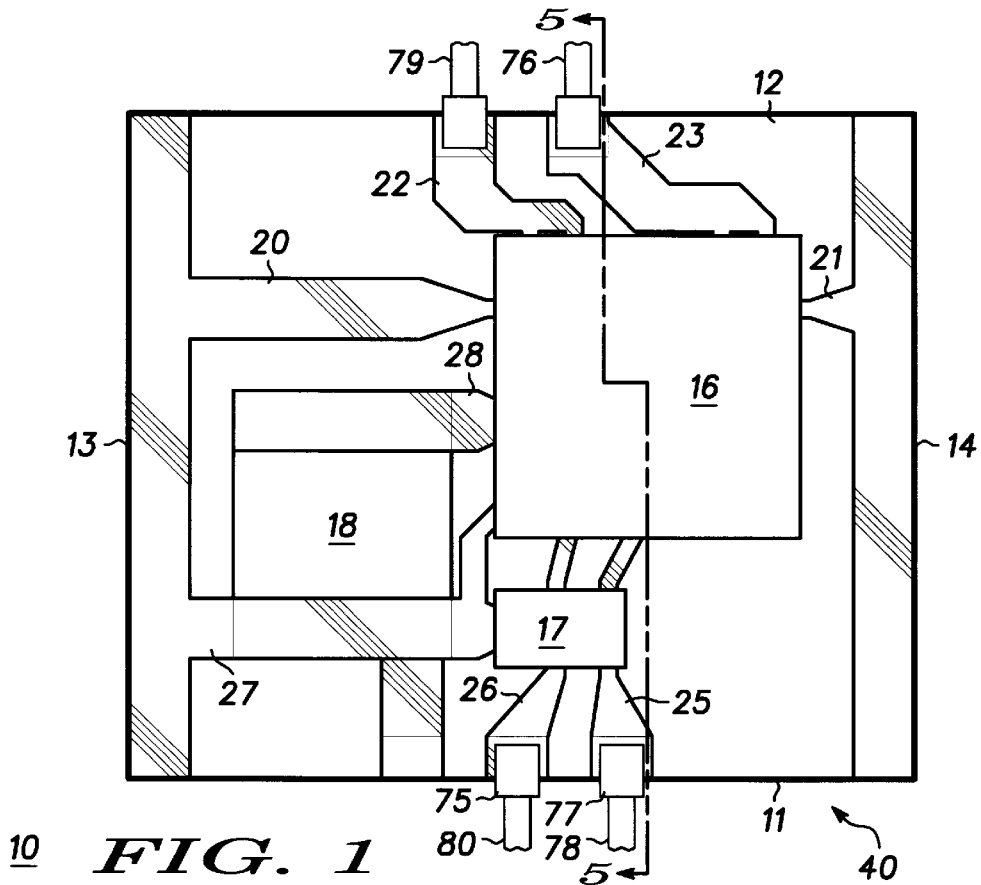
FIG. 1 is a top view of an electronic assembly in accordance with an embodiment of the present invention.

FIG. 1 is a top view of an unencapsulated electronic assembly 10 in accordance with an embodiment of the present invention. Electronic assembly 10 includes a circuit element 11 having a major surface 12 on which a plurality of electrically conductive traces or interconnects 20–23 and 25–28 are formed. Circuit element 11 is also referred to as a support structure. The plurality of electrically conductive traces 20–23 and 25–28 are further illustrated and described with reference to FIG. 2. By way of example, circuit element 11 is a passive circuit element such as a chip capacitor having four sides, wherein the first and second sides are opposite each other and the third and fourth sides are opposite each other. Preferably, electrodes 13 and 14 are formed on the first and second sides of chip capacitor 11. A control circuit 16, an electrostatic discharge protection diode 17, and a capacitor 18 are coupled to chip capacitor 11 via the plurality of electrically conductive traces 20–23 and 25–28. The fourth side is indicated by reference number 40 to aid in explaining the side view shown in FIG. 4.

Electronic assembly 10 includes clips 75, 77, 76, and 79 that electrically connect conductive traces 26, 25, 23, and 22, respectively to corresponding conductive traces (shown in FIG. 3) that are on the other side of circuit element 11. Leads 80 and 78 extend from clips 75 and 77, respectively, and allow transmission of electrical signals to and from electronic assembly 10. The clips and leads are further illustrated and described with reference to FIG. 5.

In accordance with an airbag application, chip capacitor 11 provides an energy reservoir for firing a squib. Capacitor 18 maintains the operational bias of electronic assembly 10 and control circuit 16 controls the operation of electronic assembly 11.

Figure 2:
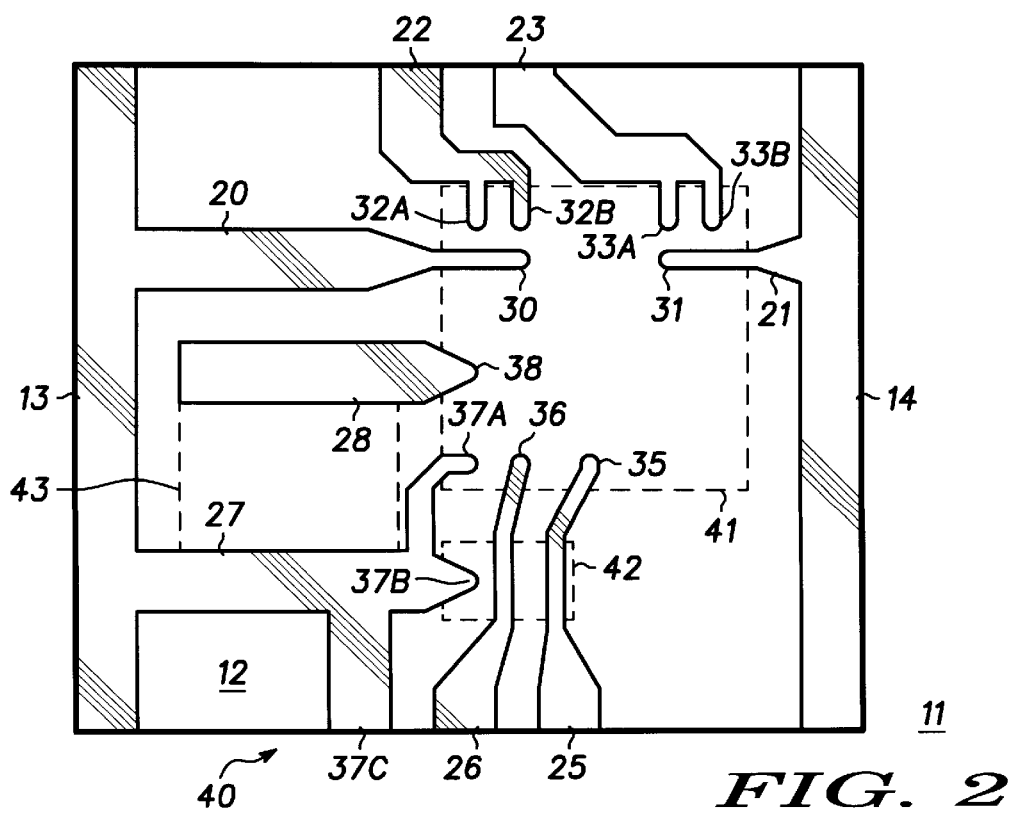
FIG. 2 is a top view of a circuit element of the electronic assembly of FIG. 1.

Now referring to FIG. 2, a top view of chip capacitor 11 having the plurality of electrically conductive interconnects 20–23 and 25–28 is shown. It should be noted that the same reference numerals are used in the figures to denote the same elements. Three regions 41, 42, and 43 outlined by broken lines are also shown in FIG. 2. Region 41 is located on the portion of major surface 12 over which control circuit 16 (shown in FIG. 1) is placed. Region 41 is also referred to as a control circuit footprint. Interconnect 20 extends from electrode 13 to control circuit footprint 41, tapering to a die pad coupling region 30, which is within control circuit footprint 41. Interconnect 21 extends from electrode 14 to control circuit footprint 41, tapering to a die pad coupling region 31. Die pad coupling regions 30 and 31 are on opposite sides of control circuit footprint 41 and allow the coupling of chip capacitor 11 to control circuit 16. Interconnect 22 extends from the third side of chip capacitor 11 to control circuit footprint 41 and bifurcates into two die pad coupling regions 32A and 32B. Likewise, interconnect 23 extends from the third side of chip capacitor 11 to control circuit footprint 41 and bifurcates into two die pad coupling regions 33A and 33B. Interconnects 22 and 23 provide a means for transmitting a control signal to, for example, a squib in an airbag application.

Interconnect 25 extends from the fourth side 40 of chip capacitor 11 to control circuit footprint 41 and terminates in a die pad coupling region 35. Likewise, interconnect 26 extends from fourth side 40 of chip capacitor 11 to control circuit footprint 41 and terminates in a die pad coupling region 36. It should be noted that interconnects 25 and 26 extend through electrostatic damage (ESD) protection device region 42.

Interconnect 27 extends from electrode 13 through capacitor footprint 43 and bifurcates into die pad coupling regions 37A and 37B. Die pad coupling region 37A extends into control circuit region 41, whereas die pad coupling region 37B extends into device region 42. Further, interconnect 27 includes an extension 37C that extends to fourth side 40 of chip capacitor 11. Interconnect 28 electrically couples capacitor footprint 43 to control circuit footprint 41. Region 38 of interconnect 28 serves as a die pad coupling region. Interconnects 27 and 28 are on opposite sides of capacitor footprint 43 and allow the coupling of capacitor 18 to chip capacitor 11 and the electrical coupling of capacitor 18 to control circuit 16. By way of example, electrically conductive interconnects 20–23 and 25–28 are formed by depositing a refractory metal on surface 12 and patterning the refractory metal to be a metal layer having a desired pattern. Techniques for patterning the metal layer include screen printing, photolithography, or the like. Suitable materials for the refractory material include molybdenum, titanium, or the like. A conductive material such as, for example, nickel is plated on the refractory material, which is then covered by a low contact resistance material such as, for example, gold, palladium, solder, or a combination thereof. It should be noted that the type of conductive material of conductive traces 20–23 and 25–28 is not a limitation of the present invention. For example, conductive traces 20–23 and 25–28 can be copper.

Although interconnects 22, 23, and 37 are shown as having bifurcations, it should be understood this is not a limitation of the present invention. In other words, interconnects 22, 23, and 27 as well as interconnects 21, 25, 26, 30, 35, 36, and 38 may have one or more die pad coupling regions. Increasing the number of die pad coupling regions per conductive trace allows the conductive traces to support a larger current density.

Figure 3:
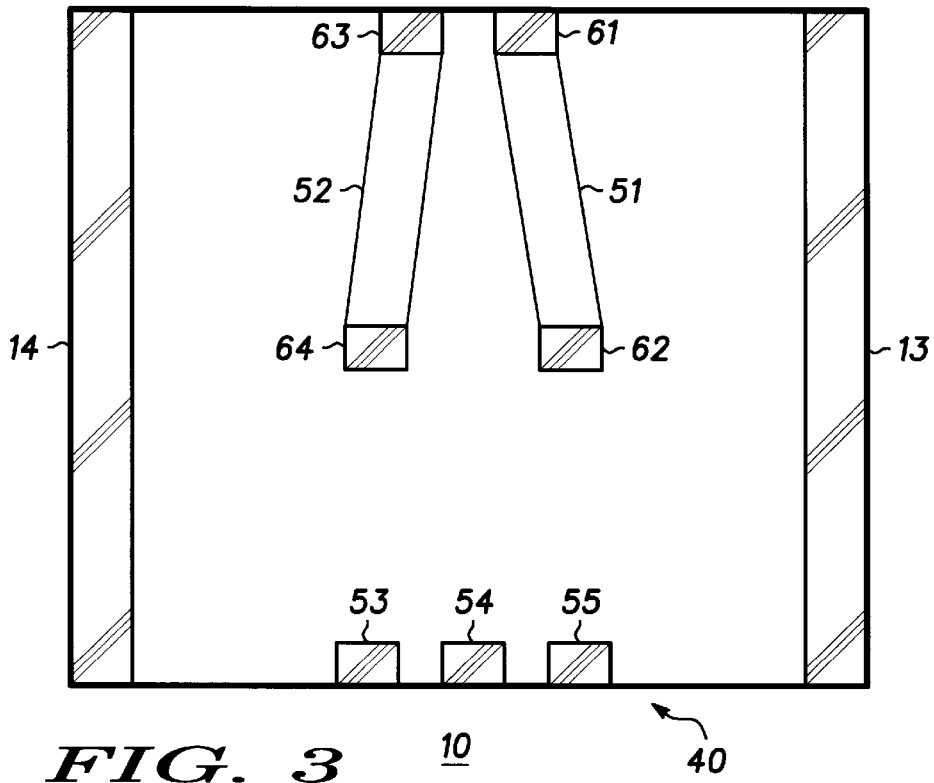
FIG. 3 is a bottom view of the circuit element of FIG. 2.

FIG. 3 is a bottom view of chip capacitor 11 and illustrates a plurality of electrically conductive interconnects 51 and 52 formed on a bottom surface of chip capacitor 11. Preferably, interconnect 51 couples a clip pad 61 located adjacent the third side of chip capacitor 11 to a terminal pad 62 located in a central portion of chip capacitor 11. Likewise, interconnect 52 couples a clip pad 63 located adjacent the third side of chip capacitor 11 to a terminal pad 64 located in a central portion of chip capacitor 11. In addition, three support pads 53, 54, and 55 are formed on portions of bottom surface 13 adjacent the fourth side of chip capacitor 11.

Figure 4:
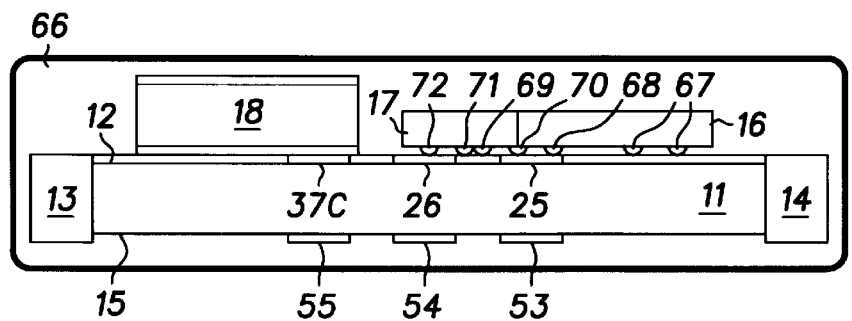
FIG. 4 is a side view of the electronic assembly of FIG. 1.

FIG. 4 is a view from side 40 of electronic assembly 10 protected by an encapsulating material 66 such as, for example, a mold compound. What is shown in FIG. 4 is chip capacitor 11 having major surfaces 12 and 15. Control circuit 16 is bonded to die pad coupling region 31 of electrical interconnect 21 by conductive bumps 67. In addition, control circuit 16 is electrically connected to die pad coupling region 35 of electrical interconnect 25 via a conductive bump 68 and to die pad coupling region 36 of electrical interconnect 26 via a conductive bump 69. By way of example, conductive bumps are comprised of copper having gold or solder plated thereon. It should be understood that for the purposes of clarity not all of the conductive bumps that couple control circuit 16 to chip capacitor 11 are shown. For example, conductive bumps may also be formed on die pad coupling regions 30, 32A, 32B, 33A, 33B, 37A, and 38 so that other circuitry on control circuit 16 may be electrically coupled to electronic assembly 10.

ESD protection device 17 is electrically connected to electrical interconnects 25, 26, and 27 via conductive bumps 70, 71, and 72, respectively. As described hereinbefore, capacitor 18 is electrically connected to interconnects 27 and 28.

Also shown in FIG. 4 are support pads 53, 54, and 55, which provide support structures for electrically coupling interconnects 25 and 26 and extension 37C, respectively, to backside 13.

Encapsulating material 66 serves as a means for protecting circuit element 11 and the components mounted to circuit element 11. It should be understood that encapsulating material 66 is not limited to being a mold compound but may be epoxy, thermoplastic, ceramic, etc.

Figure 5:
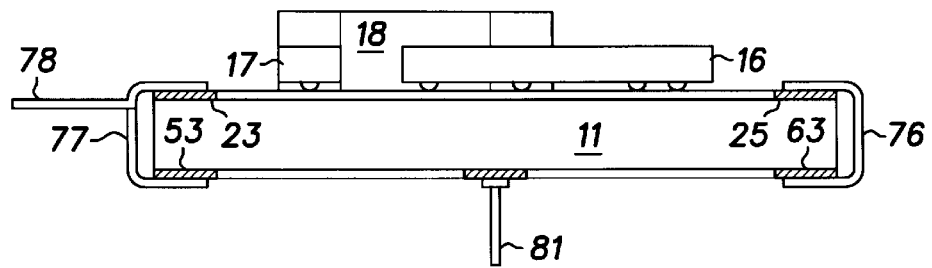
FIG. 5 is a cross-sectional view along section line 5—5 of the electronic assembly of FIG. 1.

FIG. 5 illustrates electronic assembly 10 along section line 5—5 of FIG. 1. In particular, FIG. 5 illustrates control circuit 16, ESD protection device 17, and capacitor 18 coupled to chip capacitor 11. FIG. 5 further illustrates a connector clip 76 that couples electrical interconnect 23 to support pad 53 and a connector clip 77 that couples electrical interconnect 25 to support pad 63. A lead 78 extends from connector clip 77 and a connector pin 81 extends from terminal pad 62. It should be understood that the mechanism for coupling the interconnects on the two sides of circuit element 11 is not limited to being clips. For example, surface metallization on the edge of circuit element 11 can also be used. Although not shown, it should be understood that lead 78 and connector pin 81 protrude from encapsulant 66 to allow electrically interconnecting electronic assembly 10 with other circuitry.

Figure 6:
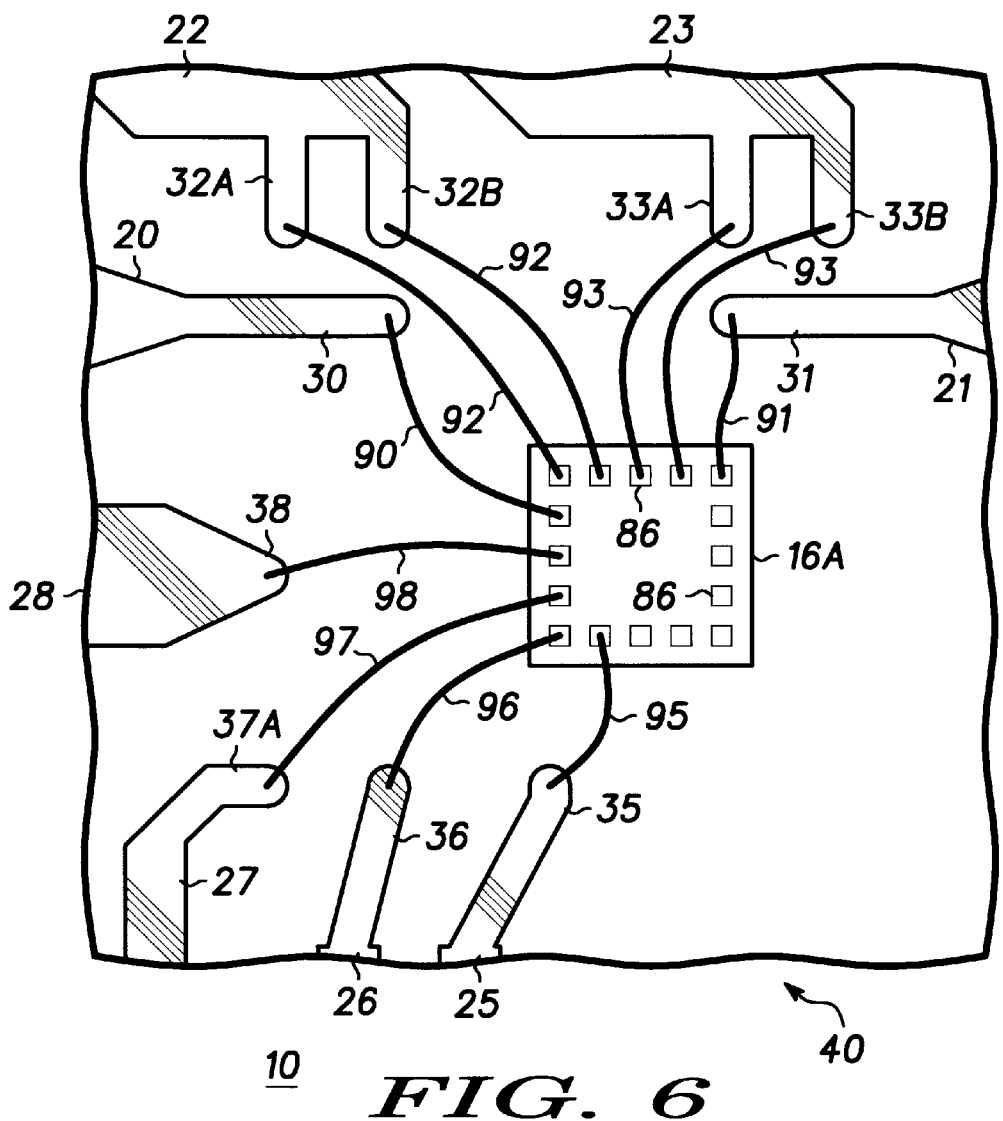
FIG. 6 is a top view of a portion of a circuit element in accordance with another embodiment of the present invention.

FIG. 6 is a top view of a portion of a circuit element in accordance with another embodiment of the present invention. What is shown in FIG. 6 is a control circuit 16A mounted to surface 12 of circuit element 11. Control circuit 16A has a plurality of bond pads 86 that are coupled to conductive traces 20–23 and 25–28 via wirebonds 90–93 and 95–98, respectively.

By now it should be appreciated that an electronic assembly and a method for manufacturing the electronic assembly have been provided. An advantage of the present invention is that it reduces the size of the electronic assembly by using a portion of the circuitry as a substrate. The present invention is suitable for use with flip-chip techniques, tape automated bonding techniques, wirebond techniques, etc. Further, the present invention is compatible with standard assembly processes and can be readily tailored to a desired form factor. Further, it should be understood the present invention is not limited to use in airbag systems but is suitable for use in any application in which it is desirable to decrease the size of the electronic assemblies.

We claim:

1. A support structure, comprising:
   a chip capacitor having a first major surface opposite a second major surface, a first side, and a second side, a first electrode at the first side and a second electrode at the second side; and
   at least one electrically conductive trace disposed directly on the first major surface, wherein the at least one electrically conductive trace is coupled to one of the first electrode and the second electrode.

2. The support structure of claim 1, further including at least one electrically conductive trace formed on the second major surface.

3. The support structure of claim 1, wherein the at least one electrically conductive trace comprises a metal layer.

4. The support structure of claim 3, wherein the metal layer is covered with a metal selected from the group consisting of gold, palladium, copper, and solder.

5. An electronic assembly, comprising:
   a circuit element having a first major surface opposite a second major surface, a first electrode, and a second electrode;
   a first electrically conductive trace disposed directly on the first major surface and electrically coupled to one of the first electrode and the second electrode; and
   a first electronic component coupled to the first electrically conductive trace.

6. The electronic assembly of claim 5, wherein the circuit element is a passive circuit element.

7. The electronic assembly of claim 5, wherein the circuit element is a chip capacitor.

8. The electronic assembly of claim 5, further including a second electrically conductive trace disposed on the second major surface.

9. The electronic assembly of claim 5, wherein the first electrically conductive trace is coupled to the first electrode.

10. The electronic assembly of claim 5, further including a capacitor coupled to the first electrically conductive trace.

11. The electronic assembly of claim 8, further including:
   third and fourth electrically conductive traces disposed on the first major surface; and
   a diode having first and second terminals coupled to the third and fourth electrically conductive traces, respectively.

12. The electronic assembly of claim 11, further including a control circuit coupled to the first electrically conductive trace.

13. The electronic assembly of claim 5, further including means for protecting the circuit element, wherein the means for protecting the circuit element surrounds the circuit element.

14. The electronic assembly of claim 13, wherein the means for protecting the circuit element comprises a mold compound.

15. The electronic assembly of claim 5, wherein the first electronic component is coupled to the first electrically conductive trace via a one of a conductive bump or a wirebond.

\* \* \* \* \*